United States Patent [19]
Slater et al.

[11] Patent Number: 6,016,054
[45] Date of Patent: Jan. 18, 2000

[54] WATT HOUR METER REGISTRATION CALIBRATION METHOD AND APPARATUS

[75] Inventors: Byron J. Slater; John T. Voisine; Gregory L. Dykstal, all of Lafayette, Ind.

[73] Assignee: Siemens Transmission & Distribution, LLC, Wendell, N.C.

[21] Appl. No.: 08/892,484

[22] Filed: Jul. 14, 1997

[51] Int. Cl.⁷ .................................................. G01R 19/00
[52] U.S. Cl. .......................................... 324/142; 324/138
[58] Field of Search .................................. 324/142, 137, 324/138, 107, 152

[56] References Cited

U.S. PATENT DOCUMENTS

| | | | |
|---|---|---|---|
| 2,626,297 | 1/1953 | Leippe | 324/137 |
| 2,759,151 | 8/1956 | Wagner | 324/117 R |
| 2,930,979 | 3/1960 | Clarke, Jr. et al. | 324/107 |
| 3,150,317 | 9/1964 | Morong, Jr. et al. | 324/107 |
| 3,493,862 | 2/1970 | Ramsey, Jr. et al. | 324/137 |
| 3,496,466 | 2/1970 | Takabayashi | 324/137 |
| 3,500,199 | 3/1970 | Ramsey, Jr. | 324/138 |
| 3,602,814 | 8/1971 | Quirk | 324/137 |
| 3,609,544 | 9/1971 | Milligan et al. | 324/138 |
| 3,611,137 | 10/1971 | Graefnitz et al. | 324/138 |
| 3,683,276 | 8/1972 | Ramsey, Jr. | 324/137 |
| 3,688,192 | 8/1972 | Ramsey, Jr. | 324/137 |
| 3,710,245 | 1/1973 | Clay et al. | 324/138 |
| 3,790,888 | 2/1974 | Morong, Jr. | 324/138 |
| 3,792,353 | 2/1974 | Loika, Jr. | 324/137 |
| 3,815,011 | 6/1974 | Milkovic | 324/123 R |
| 3,881,149 | 4/1975 | Kiko | 324/127 |
| 4,213,090 | 7/1980 | Keever et al. | 324/138 |
| 4,238,729 | 12/1980 | MacFadden et al. | 324/152 |
| 4,423,375 | 12/1983 | Ramsey, Jr. et al. | 324/137 |
| 4,424,485 | 1/1984 | Zisa | 324/137 |
| 4,467,269 | 8/1984 | Barzen | 323/356 |
| 4,547,730 | 10/1985 | Morong | 324/137 |
| 4,649,337 | 3/1987 | Stucker | 324/138 |
| 4,782,286 | 11/1988 | Coburn et al. | 324/137 |
| 5,594,333 | 1/1997 | Whipple, III | 324/142 |
| 5,604,414 | 2/1997 | Milligan et al. | 324/142 X |

*Primary Examiner*—Josie Ballato
*Assistant Examiner*—Minh Tang

[57] ABSTRACT

A phase adjustment circuit is provided for use in an inductive drive utility meter that employs a current stator and a rotating disk. The phase adjustment circuit includes an impedance circuit and a first current limiting device. The impedance circuit has at least first and second terminals, and is disposed in a flux inducing relationship with the current stator such that the flux within the current stator induces a voltage across the first and second terminals of the impedance circuit. The first current limiting device has a first bias threshold, and is connected between the first and second terminals of the impedance circuit. The current limiting device is operable to inhibit current flow in a first direction through the impedance circuit based on whether the voltage induced on said impedance circuit exceeds the first bias threshold. The current flow through the impedance circuit then induces a compensation flux density component onto the current stator, which in turn affects registration of the meter.

23 Claims, 4 Drawing Sheets

_6,016,054_

WATT HOUR METER REGISTRATION CALIBRATION METHOD AND APPARATUS

FIELD OF THE INVENTION

The present invention relates generally to watt-hour meters, and particularly, to induction-driven watt-hour meters.

BACKGROUND OF THE INVENTION

Electrical utilities employ watt-hour meters to track, among other things, customer energy consumption. A common type of watt-hour meter for residential use is the induction meter. An induction meter includes a disk that spins at a rate of rotation that is proportional to the amount of energy consumed by a residence or other facility. To this end, induction meters typically include a voltage stator, a current stator and a rotating disk. The voltage stator generates a magnetic flux responsive to the voltage signal on the power lines of the residence. The current stator generates a magnetic flux responsive to the current or load signal on those power lines. The voltage and current stators are positioned to impart their respective fluxes onto the rotating disk such that it rotates at a rate proportional to the amount of energy consumed. The rotating disk then drives mechanical and/or electronic registers that accumulate the rotations of the disk. The utility uses the information from the registers to determine energy consumption for specified periods of time.

Induction meters are well known. An important aspect of all meters, including induction meters, is the accuracy with which they measure energy consumption. Inaccurate meters can result in overcharging or undercharging customers, which is undesirable. Accordingly, industry and government regulatory bodies, both domestic and international, specify requirements for meter accuracy.

One important set of requirements relates to registration error of the meter. Registration error is the amount of variance of the disk rotation rate, or registration, from an expected disk rotation rate. Registration error is tested by observing actual registration of a meter under known load current conditions. Typically, registration is tested at several known load current conditions, and the meter must exhibit registration error within limits for each of the load current conditions. For example, specific tests are carried out at 3 amperes of load current at unity power factor, 6 amperes of load current at 0.5 power factor, 200 amperes at unity power factor, and 200 amperes at 0.5 power factor. If a meter does not fall within a required window for each test load, then the meter must be calibrated until it complies.

However, proper calibration of a particular meter to comply with registration requirements is not always easily achieved. While several methods of calibrating or adjusting registration are known, such methods may cause reduction of error under some test conditions but undesirably increase error under other test conditions. It is therefore desirable to employ one or more calibration methods that are capable of adjusting registration only under certain load current conditions. Such a calibration method could be used to adjust registration at load current conditions in which the meter is in noncompliance without affecting the meter registration at load current conditions in which the meter is in compliance.

Two common calibration methods that calibrate registration only under selected conditions are light load adjustments and phase lag adjustments. Such calibration methods are in common use.

The phase lag adjustment adjusts meter registration for load currents at 0.5 power factor without affecting load currents at unity power factor. The phase lag adjustment is typically embodied by a shorted turn of copper wrapped around either the voltage stator or the current stator. The shorted turn slightly alters the phase of the magnetic flux in either the current stator or the voltage stator by introducing an out-of-phase flux density component therein. The out-of-phase flux density component changes the overall phase of the flux generated in the stator. The change in stator flux phase typically alters meter registration in a manner that reduces registration error. The shorted turn typically does not, however, appreciably adjust registration at unity power factor because of the disparity of effect of slight phase angle changes at unity power factor and 0.5 power factor.

The light load adjustment is used to compensate for registration errors at low load current. Light load adjustments are well known and discussed, for example, in U.S. Pat. No. 4,782,286 to Coburn et al. and U.S. Pat. No. 4,423,375 to Ramsey Jr., et al. Those patents and other light load adjustment techniques employ magnetic and/or non-magnetic material near the pole faces of the voltage stator to shade or adjust the overall flux paths through the rotating disk.

While both of the above methods provide registration adjustments for particular load current conditions, they can not adequately address all situations in which calibration is necessary. For example, it has been observed in some meters that registration at 0.5 power factor is often too low at 6 amperes and too high at 200 amperes. Such disparity is often caused by nonlinearities in the voltage and current stator cores. That disparity is not troublesome if the amount of error at 6 amperes and 200 amperes is tolerable. However, in some cases, the amount of error is not tolerable particularly in certain foreign countries in which the tolerances at 6 amperes and 200 amperes are relatively narrow.

The shorted turn method is inadequate to correct such a problem because the shorted turn method uniformly adjusts the registration of the meter at 0.5 power factor at both 6 amperes and 200 amperes. Thus, while the shorted turn may reduce registration at 200 amperes, it also undesirably reduces registration at 6 amperes. Analogously, the light load adjustment can not resolve such a problem because it uniformly adjusts meter registration for low magnitude load currents at both 0.5 power factor and unity power factor. As a result, while the light load adjustment may be employed to increase registration at 0.5 power factor and 6 amperes, it also undesirable increases registration at low load currents at unity power factor.

Accordingly, there exists a need for a calibration method and/or apparatus that adjusts registration in a non-uniform manner for 0.5 power factor test load current conditions. Such a calibration method would permit calibration of a meter such that it provides accurate registration readings of an induction meter at both low and high current at 0.5 power factor, without distorting the registration reading at unity power factor.

SUMMARY OF THE INVENTION

The present invention fulfills the above need, as well as others, by providing an impedance circuit connected to a current limiting device disposed in a flux inducing relationship with the voltage stator. The current limiting device and impedance circuit operate to adjust registration of the meter based on whether the load current exceeds a predetermined threshold. The registration adjustment thus compensates for registration error contributed by, among other things, nonlinearities in the voltage and current stator by changing registration at some load current levels but not others. Preferably, the current limiting device and impedance circuit do not appreciably affect registration under unity power factor conditions.

In one embodiment, the present invention includes a phase adjustment circuit for use in an inductive drive utility meter that employs a current stator and a rotating disk. The phase compensation circuit adjusts the phase of flux generated in the current stator, and includes an impedance circuit and a first current limiting device. The impedance circuit has at least first and second terminals, and is disposed in a flux inducing relationship with the current stator. The first current limiting device has a first bias threshold, and is connected between the first and second terminals of the impedance circuit. The current limiting device is operable to inhibit current flow in a first direction through the impedance circuit based on whether the voltage induced on said impedance circuit exceeds the first bias threshold.

When the current limiting device allows current flow through the impedance circuit, the impedance circuit induces a compensation flux in the current stator, which in turn affects registration of the meter. The phase compensation circuit therefore adjusts meter registration at some load current levels but not others. The use of the phase compensation circuit of the present invention either alone or in combination with other calibration methods allow for precise calibration of inductive meters to enable such meters to meet strict registration error tolerances requirements.

The above features and advantages, as well as others, will become more readily apparent to those of ordinary skill in the art by reference to the following detailed description and accompanying drawings.

DETAILED DESCRIPTION

Figure 1:
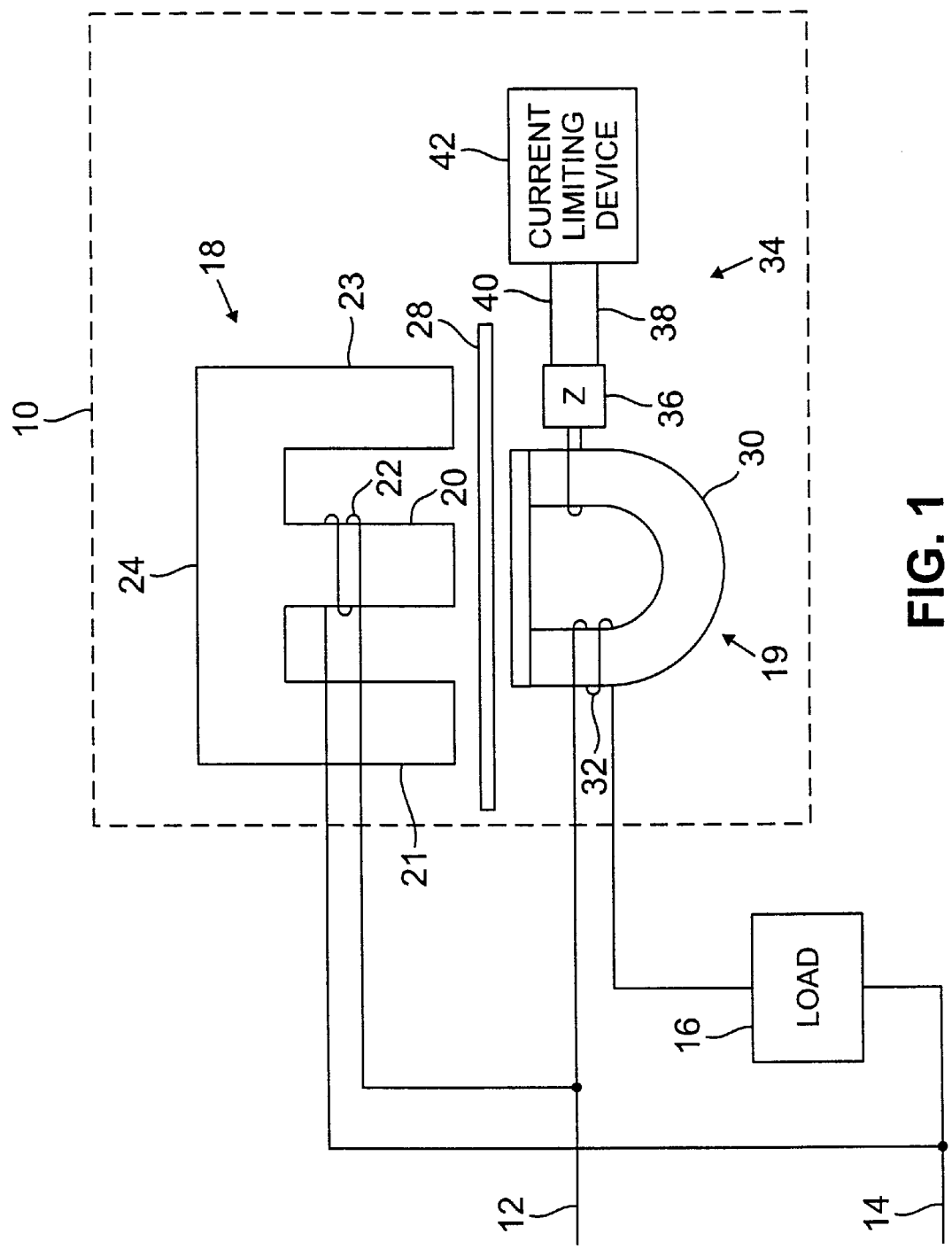
FIG. 1 shows a simplified block diagram of an inductive drive watt-hour meter according to the present invention connected to the power lines providing electrical power to a load.

FIG. 1 shows a simplified block diagram of an inductive drive watt-hour meter 10 according to the present invention connected to power lines 12 and 14. In an exemplary embodiment, the power lines 12 and 14 connect an electrical power generation facility or utility, not shown, to the load 16 for the purposes of providing power thereto. The load 16 may, for example, be the electrical system of a residence. In general, the meter 10 is connected to the power lines 12 and 14 to measure the electrical energy consumed by the load 16.

As is well known in the art, the meter 10 measures energy consumption by accumulating power consumption information over time and communicating the accumulated power information to the utility.

The watt-hour meter 10 according to the invention includes a voltage stator 18, a rotating disk 28, a current stator 19, and a phase compensation circuit 34. The watt-hour meter 10 further includes an arrangement that accumulates power consumption information. Such arrangement and other mechanisms commonly found in a watt-hour meter such as the watt-hour meter 10 are omitted from the simplified block diagram of FIG. 1 for purposes of clarity of exposition of the invention.

The voltage stator 18 comprises an E-shaped magnetic core or E-core 24. The E-core 24 has a construction and operation which is well known in the art, and includes a first leg 21, a second leg 23, and a middle leg 20. The voltage stator 18 further includes a voltage coil 22, which is disposed in a flux inducing relationship with the E-core 24. In the present embodiment, the voltage coil 22 is an N-turn winding around the middle leg 20 of the voltage stator 18. The terminals of the voltage coil 22 are connected across the power lines 12 and 14.

The current stator 19 comprises a C-shaped magnetic core or C-core 30, the construction and operation of which are also well known in the art. The current stator 19 also includes a current coil 32, which is disposed in a flux inducing relationship with the C-core 30.

The rotating disk 28 is typically a thin metallic disk constructed out of non-magnetic, electrically conductive material such as aluminum. The rotating disk 28 is rotatably mounted in the meter 10 by means not shown, and is connected to another means, not shown, for detecting and accumulating rotations of the rotating disk 28. Such means and the general configuration of the rotating disk 28 are well known, and may be for example, the corresponding structures of the model MX meter available from Landis & Gyr Utilities Services, Inc., Lafayette, Ind.

The voltage stator 18 and the current stator are advantageously configured to impose magnetic flux on the rotating disk 28 in a manner that causes the rotating disk to rotate a rate approximately proportional to the instantaneous power consumption of the load 16. Such configurations are well known, such as the configuration of the current stator, voltage stator and rotating disk in the model MX meter, discussed above.

The phase compensation circuit 34 is operably connected in a flux inducing relationship with the C-core 30, and preferably includes an impedance circuit 36 having first and second terminals 38 and 40, respectively. The phase compensation circuit also preferably includes a current limiting device 42 connected to the first and second terminals 38 and 40, respectively. The current limiting device 42 is preferably a nonlinear device such as a diode.

Figure 2:
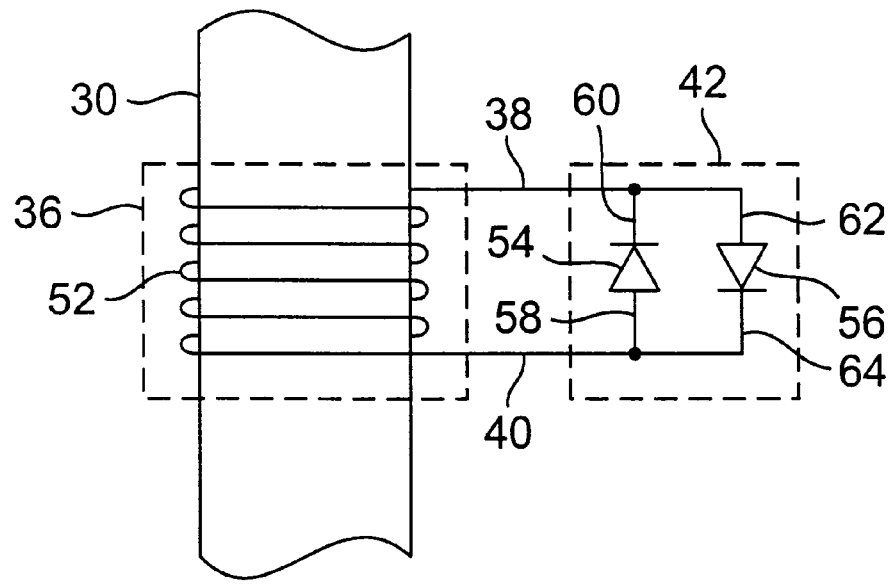
FIG. 2 shows a schematic diagram of a first embodiment of a phase compensation circuit according to the present invention.

FIG. 2 shows in further detail a first embodiment of a phase compensation circuit 34 according to the present invention. Referring to FIG. 2, in the first embodiment of the phase compensation circuit 34; the impedance circuit 36 comprise an inductive coil 52 wound around a portion of the C-core 30, and the current limiting device 42 comprises first and second diodes 54 and 56, respectively. The first diode 54 has an anode 58 connected to the second terminal 40 of the impedance circuit 36 and a cathode 60 connected to the first terminal 38 of the impedance circuit 36. The second diode 56 also has a cathode 64, which is connected to the second terminal 40, and an anode 62, which is connected to the first terminal 38.

In operation, the watt-hour meter 10 according to the present invention measures energy consumption by the load 16. To this end, the voltage stator 18 generates a first magnetic flux, $\phi_1$ having a flux density $B_1$. The first magnetic flux density $B_1$, has a magnitude and phase that are primarily dependent upon the voltage across the power lines 12 and 14. Likewise, the current stator 19 generates a second magnetic flux, $\phi_2$, having a flux density $B_2$. The second magnetic flux density $B_2$ has a magnitude and phase that are primarily dependent upon the load current level on the power lines 12 and 14.

The second magnetic flux is also influence by a compensation flux density component, to the extent there is any, generated by the phase compensation circuit 34. In addition, the first and second magnetic fluxes may include components induced by other compensation means that may be installed onto the E-core 24 and/or the C-core 30 by those of ordinary skill in the art. Such other compensation means are not the subject matter of the present invention.

As discussed above, the rotating disk 28 is advantageously configured to receive the first magnetic flux and the second magnetic flux. The rotating disk 28 rotates at a rate indicative of the power consumed by the load 16. Specifically, the rotating disk 28 rotates from forces acting on it resulting from the interaction of eddy currents produced by the flux densities $B_1$ and $B_2$ and the flux densities $B_1$ and $B_2$ themselves. In other words, the eddy current induced on the rotating disk 28 by $B_1$ interacts with $B_2$ to generate a torque force, while the eddy current induced on the rotating disk 28 by $B_2$ interacts with $B_1$ to generate another torque force. The E-core 24 and C-core 30 are arranged in the well known quadrature arrangement such that the induced torque forces cause rotation to occur in accordance with the equation $$RR = \alpha /B_1//B_2/\cos(\theta_1 - 90°)$$

where RR is the rotation rate, $\alpha$ is a constant, and $\theta_1$ is the phase angle between $B_1$ and $B_2$.

Power consumption, meanwhile, is given by the equation:

$$W = /V//I/\cos\theta_2.$$

where W is electrical power, V is a phasor representative of voltage on the power lines 12 and 14, I is a phasor representative of the current on the power lines 12 and 14, and $\theta_2$ is the phase angle between the voltage V and the current I.

Under ideal conditions, the first magnetic flux density $B_1$ has a magnitude that is proportional to the magnitude of the voltage, V Similarly, under ideal conditions, the second magnetic flux density $B_2$ has a magnitude that is proportional to the magnitude of the magnitude of the current I. The phase angle between $B_1$ and $B_2$ is ideally equal to the phase angle between V and I minus 90°. In other words, $/B_1/ = (k1)/V/, /B_2/ = (k2)/I/$, and $\theta_1 - 90° = \theta_2$, wherein k1 and k2 are constants. Substitution for the fluxes in the rotation rate equation yields the relationship $$RR = \alpha(k1)/V/(k2)/I/\cos\theta_2.$$

and if $\alpha$, k1, and k2 are replaced by a single constant $\alpha$, $$RR = \alpha W.$$

The above relationships apply to ideal conditions only. Under real world conditions, the rotation rate or registration of the rotating disk 28 is only approximately proportional to the quantity of power consumed because of nonlinearities contributed by, among other things, the voltage and current stators. Such nonlinearities can cause, for example, disparate registration errors under 0.5 power factor conditions. For example, at 0.5 power factor, registration may be too low at low load current levels, and too high at maximum load current levels.

The phase adjustment circuit 34 compensates for such nonlinearities by adjusting the registration of the meter 10 at some current conditions but not others. According to the present invention, the phase adjustment circuit 34 adjusting the phase of the second magnetic flux density based on whether the load current exceeds a certain threshold. As a result, the phase adjustment circuit 34 adjusts the registration at the meter to provide a calibration specifically targeted for variances occurring at particular load current levels.

The first embodiment of the phase compensation circuit 34 illustrated in FIG. 2 adjusts the phase of the second magnetic flux density by introducing a compensation flux density component, $B_C$, that is 90° out-of-phase with the load current flux density component, $B_L$. The phase compensation circuit 34 of FIG. 2, however, only generates a significantly non-zero compensation flux density component when the load current exceeds a predetermined threshold. The threshold may suitably be on the order of 100 amperes for a residential single phase meter. Furthermore, for similar reasons as those discussed above in connection with the prior art shorted turn, the exemplary phase compensation circuit 34 described herein does not appreciably adjust registration under unity power factor conditions.

The operation of the phase compensation circuit 34 of FIG. 2 is described in detail herebelow. As discussed above, the load current I flowing through the current coil 32 of FIG. 1 induces the load current flux density component $B_L$, in the C-core 30. Referring to FIG. 2, the load current flux density component in the C-core 30 induces a potential across the first and second terminals 38 and 40, respectively, of the inductive coil 52.

When $B_L$ is below a predetermined threshold, the induced potential across the inductive coil 52 is below the forward bias voltage of the diodes 54 and 56. As a result, the diodes 54 and 56 inhibit current from flowing in the inductive coil 52. Because current does not flow, the inductive coil 52 does not induce a flux density component into the C-core 30. As a consequence, when the load current I is below a certain predetermined threshold, the compensation flux density component $B_C$ is negligible.

However, when the load current flux density component $B_L$ is above a predetermined threshold, the induced potential across the inductive coil 52 exceeds the forward bias voltage of the diodes 54 and 56. As a result, current flows through the diodes 54 and 56 and the inductive coil 52. The current flow in the inductive coil 52 is approximately 90° out of phase with the load current because the voltage induced in the inductive coil 52 is 90° out of phase with $B_L$, and the current flow in the inductive coil is in phase with the induced voltage. The current flow in the inductive coil 52 induces a flux, and in particular, the compensation flux density component, $B_C$, into the C-core 30.

Figure 6:
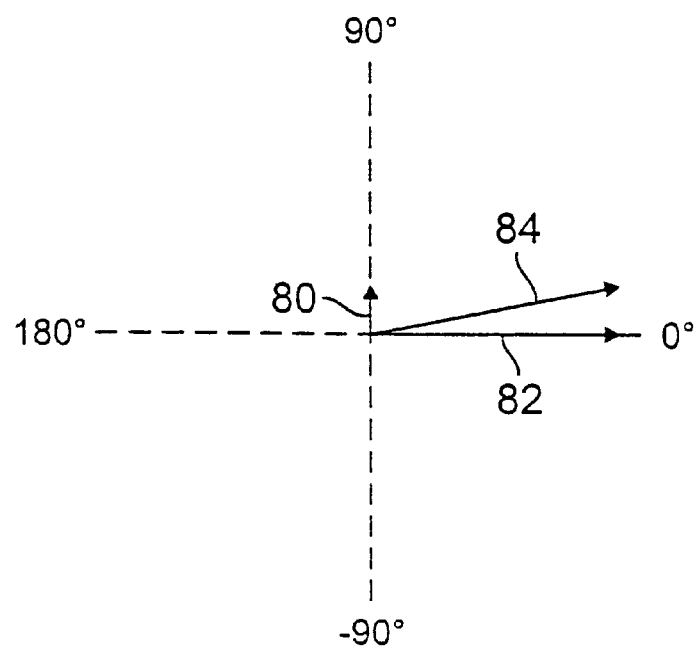
FIG. 6 shows a phasor diagram of the magnetic flux and its constituent components within the current stator of the meter of FIG. 1.

The flux density components $B_L$ and $B_C$ combine to make up the second magnetic flux density $B_2$. For further illustration, FIG. 6 shows a phasor diagram of the second magnetic flux density $B_2$ and its constituent component parts. Referring to FIG. 6, the compensation flux density component $B_C$ is represented by a first phasor 80, and the load current flux density component $B_L$ is represented as a second phasor 82. Because the current through the inductor 52 is approximately 90° out of phase with the load current, the first phasor 80 ($B_C$) is approximately 90° out of phase with the second phasor 82 ($B_L$). It is noted that the first phasor 80 ($B_C$) also has considerably less magnitude than the second phasor 82 ($B_L$). The second magnetic flux density, $B_2$, represented by a third phasor 84, is the vector sum of $B_L$ and $B_C$.

As can be seen in FIG. 6, the third phasor 84 is approximately equal to the second phasor 82 subjected to a slight phase shift. As a result, the addition of the compensation flux density component $B_C$ effectively shifts the phase of the second magnetic flux density $B_2$. The change in phase of $B_2$ affects or adjusts meter registration. Specifically, because meter registration is given by the equation $RR=/B_1//B_2/\cos(\theta_1-90°)$, the change in the phase of $B_2$ changes the ($\cos\theta_1-90°$) term, which in turn changes RR.

The amount of compensation may be manipulated by adjusting the number of turns in the inductive coil 52. The addition of turns increases the magnitude of the compensation flux density component $B_C$, thereby increasing the amount of change in $\theta_2$ and the resulting compensation. By contrast, the reduction of turns decreases the compensation flux density component, $B_C$, and the resulting amount of compensation. Those of ordinary skill in the art may readily determine the number of turns necessary to properly adjust a particular meter based on the amount of registration error at 0.5 power factor. It is noted that the use of two diodes in the first embodiment of the phase compensation circuit of FIG. 2 allows current to flow through the inductive coil 52 in both cycles of the induced alternating current. The use of two diodes thus allows both cycles of the alternating current to induce a flux density component in the C-core 30, which reduces the amount of turns required in the inductive coil 52 to achieve a particular amount of compensation.

Figure 3:
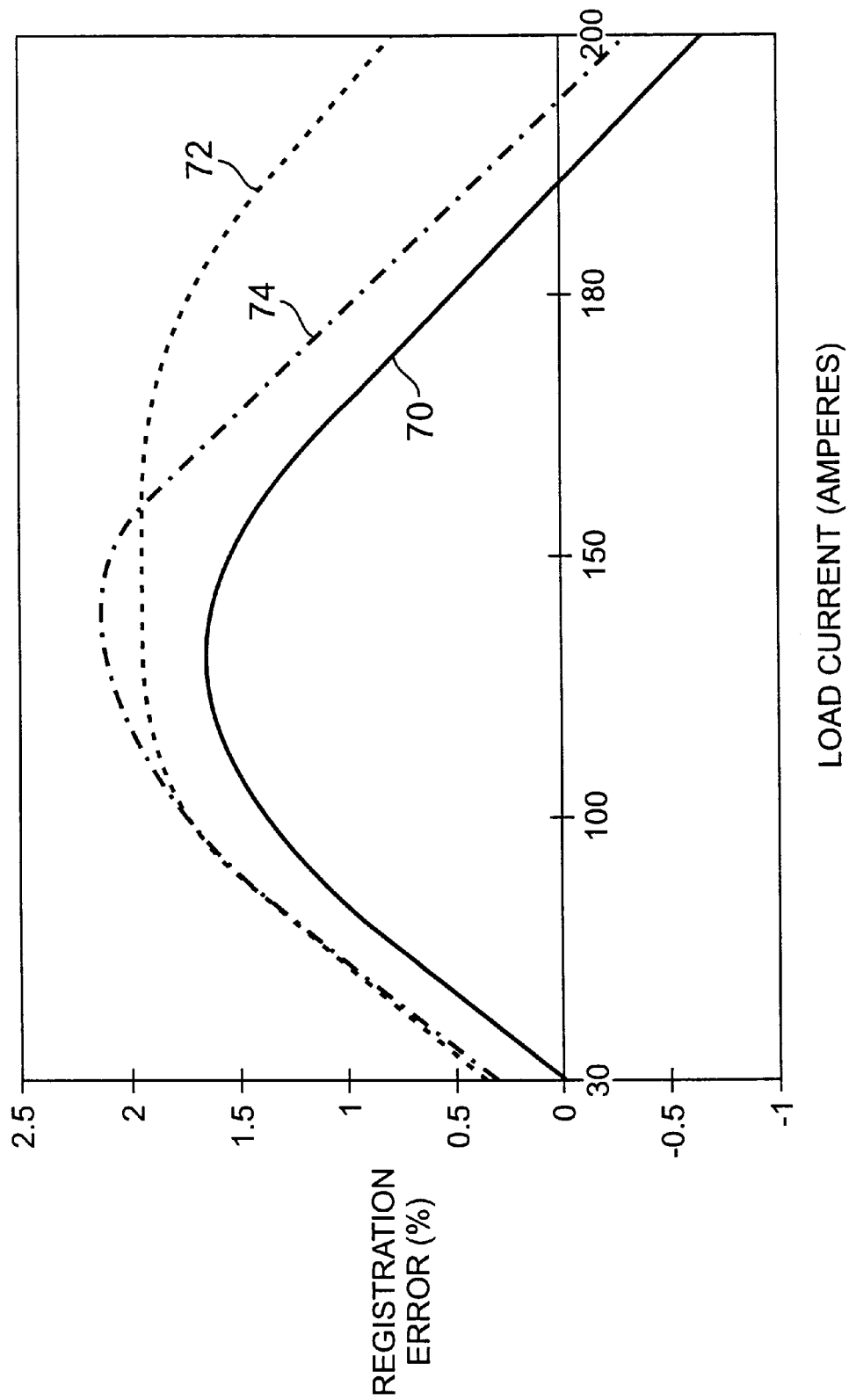
FIG. 3 shows a graphical representation of the response curves of registration error as a function of load current for a prior art meter and a meter according to the present invention.

FIG. 3 shows a graphical representation of the relationship between registration error in a model MX meter available from Landis & Gyr and load current for a number of load current conditions.

The first load curve 70 represents the registration error of a model MX meter under conditions in which the power factor is equal to unity, which means that the load current and line voltage were substantially in phase. It is noted that for the same reasons as those discussed above in connection with the prior art shorted turn compensation method, the phase compensation circuit of the present invention does not affect unity power factor load current conditions. Accordingly, the first load curve 70 represents the registration error measured on the MX both with and without the phase compensation circuit of the present invention.

The second load curve 72 represents the registration error of a model MX meter that does not include a phase compensation circuit according to the present invention. The third load curve 74 represents the registration of the same meter except that a phase compensation circuit has been added to the meter. The MX meter used to obtain the results in the third load curve 74 employed the phase compensation circuit 34 of FIG. 2. The first diode 54 and the second diode 56 comprised Schottky diodes. The inductive coil 52 was a wire coil consisting of 21 turns of 28 gage wire. Schottky diodes were preferred because it has a relatively low forward bias voltage bias, approximately 0.45 volts, which reduced the number of turns in the inductive coil that were required to generate enough potential to turn on the diodes.

For all three load curves 70, 72 and 74, the MX meter was precalibrated using conventional techniques such that the registration error was within an acceptable tolerances under low load current conditions. Specifically the MX meter was calibrated to exhibit registration errors that were within tolerance limits for Taiwan under the following conditions: unity power factor at 3 amperes; 0.5 power factor at 6 amperes; and 0.5 power factor at 30 amperes. The registration error at high load currents, however, varied substantially. Specifically, the meter exhibited a registration error at 200 amperes an unity power factor that was approximately +0.5%, as illustrated by the first load curve 70. At 0.5 power factor, however, the same meter exhibited a registration error at 200 amperes that was approximately +1.0%, as illustrated by the second load curve 72. When the phase compensation circuit of the present invention was added, the same meter exhibited a registration error of approximated −0.2% at 200 amperes and 0.5 power factor, as illustrated by the third load curve 74.

As illustrated by a comparison of the load curves 72 and 74, the phase compensation circuit 34 of FIG. 2 reduced the high load current registration error at 0.5 power factor without affecting the low load current registration or the unity power factor registration. Accordingly, the phase compensation circuit successfully reduced the registration error at the high load current, 0.5 power factor test point without affecting the other pertinent load current test points. It is noted, however, that error actually increased for a small portion of the third load curve 74. Nevertheless, the phase compensation circuit 34 reduced the overall registration error substantially, particularly at the high currents at which meter registration is often tested.

The present invention thus provides a method and apparatus for compensating for registration errors in an inductive meter that performs an adjustment at some load current levels and not others. Accordingly, meter manufacturers may employ the phase compensation circuit of the present invention in combination with other known calibration methods to obtain a precise calibration sufficient to allow the meter to achieve required registration standards at high and low current levels. For example, a shorted turn, or light load screw, or other device may be used to precalibrate the meter, i.e., adjust the registration error until the low load current registration error and unity power factor registration error is acceptable. If, after such calibration, meter registration at 0.5 power factor and high load current conditions is not within the required tolerance, then the phase compensation circuit according to the present invention may be implemented to adjust that registration error.

Figure 4:
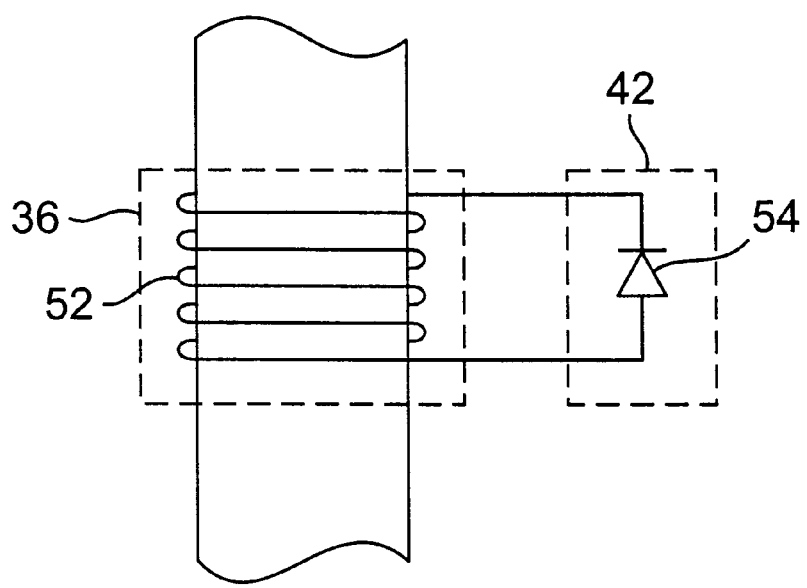
FIG. 4 shows a schematic diagram of a second embodiment of a phase compensation circuit according to the present invention.

It is noted that the phase compensation circuit 34 of FIG. 2 is given by way of example only and other embodiments of the phase compensation circuit 34 may readily be employed. For example, FIG. 4 shows a second embodiment of a phase compensation circuit according to the present invention that includes only a single diode. For purposes of clarity, components in FIG. 4 are identified by the same reference numbers as like components of FIG. 2.

Similar to the embodiment of FIG. 2, the second embodiment of the phase compensation circuit 34 includes a current limiting device 42 and an impedance circuit 36, which preferably includes an inductive coil 52. In this embodiment, the current limiting device 42 is a single diode, shown as the first diode 54. The first diode 54 may suitably be any nonlinear rectifier that allows current flow at some voltage levels, but not at others. Preferably, the first diode 54 is a Schottky diode, which has a low forward bias voltage.

The second embodiment of the phase compensation circuit shown in FIG. 4 operates in essentially the same manner as the phase compensation circuit of FIG. 2. However, because the first diode 54 of FIG. 4 can only conduct current in a single direction, only half of the AC cycles of voltage will cause the first diode 54 to conduct. As a result, the inductive coil 52 induces a compensation flux density component, $B_C$, of lesser magnitude than that which is possible with two diodes, such as those illustrated in FIG. 2.

Figure 5:
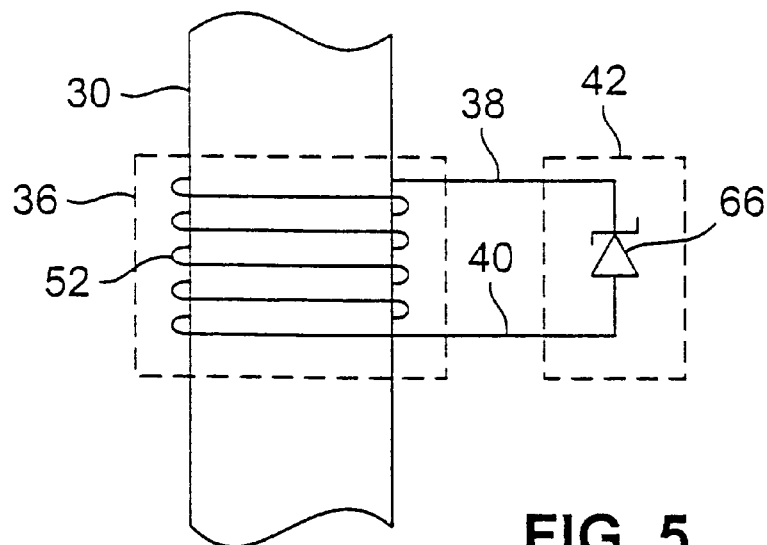
FIG. 5 shows a schematic diagram of a third embodiment of a phase compensation circuit according to the present invention.

FIG. 5 shows a third embodiment of a phase compensation circuit according to the present invention. In the embodiment shown in FIG. 5, the phase compensation circuit 34 is operable to provide essentially three levels of compensation, including no compensation, a low level of compensation, and a high level of compensation. The amount of compensation depends upon whether the load current exceeds a first threshold and/or a second threshold. For purposes of clarity, components in FIG. 5 are identified by the same reference numbers as like components of FIG. 2.

The third embodiment of the phase compensation circuit 34 includes a current limiting device 42 and an impedance circuit 36, which preferably includes an inductive coil 52. In this embodiment, the current limiting device 42 is a Zener diode 66 having a forward bias voltage and a reverse bias voltage.

In operation, the third embodiment of the phase compensation circuit shown in FIG. 4 operates in a similar manner as the phase compensation circuit of FIG. 2. However, the third embodiment of the phase compensation circuit provides no compensation, a low level of compensation, or a high level of compensation.

When the load current is below a first threshold, the load current flux density component in the C-core 30 does not induce enough voltage on the inductive coil 52 to reach the forward bias voltage or reverse bias voltage of the Zener diode 66. As a result, no current flows through the inductive coil and $B_C$ is negligible.

When the load current is above the first threshold, but below the second threshold, the load current flux density component on the C-core 30 induces sufficient voltage on the inductive coil to reach the forward bias voltage, but not the reverse bias voltage, of the Zener diode 66. As a result, current flows through the inductive coil for half of the AC cycles, similar to the manner in which the circuit of FIG. 4 operates. Accordingly, when the load current is between the first and second thresholds, the third embodiment of the phase compensation circuit of FIG. 5 provides a low level of compensation.

When the load current is above the first and second thresholds, the load current flux density component induces sufficient voltage on the inductive coil 52 to reach the forward and reverse bias voltage of the Zener diode 66. As a result, current flows through the inductive coil for both of the AC cycles, similar to the manner in which the circuit of FIG. 2 operates. It is noted, however, that because the reverse bias voltage is higher than the forward bias voltage of the Zener diode 66, proportionately less of each AC cycle will exceed the reverse bias voltage, and therefore the compensation level achieved is less in the circuit of FIG. 5 than that of the circuit of FIG. 2 under similar conditions. Nevertheless, when the load current exceeds the first and second thresholds, the third embodiment of the phase compensation circuit of FIG. 5 provides a high level of compensation, as compared to the situation in which neither threshold, or only the first threshold, is reached.

It will be noted that the above embodiments of the present invention are merely illustrative. Those of ordinary skill in the art may readily devise their own implementations that incorporate the principles of the present invention and fall within the spirit and scope thereof. For example, while the use of Schottky diode for the diodes in FIGS. 2 and 4 has the advantages described above, an ordinary pn junction diode may readily be used and would achieve some of the benefits of the present invention. More importantly, the current limiting circuit 42, in general, may comprise one or more other types of nonlinear devices that operate to conduct current in a nonlinear relationship with the amount of voltage induced on the impedance circuit. For example, a silicon fuse may be used as the current limiting device 42 of FIG. 1. A silicon fuse operates to conduct current at voltage levels below a predetermined threshold, and inhibits current above a predetermined threshold. Accordingly, the silicon fuse may be used in the phase compensation circuit according to the present invention to adjust the registration at relatively low current levels without affecting registration at relatively high current levels.

We claim:

1. In an inductive drive meter for metering a facility having a load current, the inductive drive meter including a rotating disk and a current stator, a phase adjustment circuit comprising an impedance circuit having at least first and second terminals, at least one nonlinear device having at least first and second terminals connected, respectively, to the first and second terminals of the impedance circuit, said impedance circuit disposed in a flux inducing relationship with said current stator, wherein said phase adjustment circuit generates a compensation flux density based on whether the load current exceeds a predetermined threshold.

2. The phase adjustment circuit of claim 1 wherein said impedance circuit comprises an inductive coil having an interior in which a portion of the current stator is located.

3. The phase adjustment circuit of claim 1 wherein said at least one nonlinear device includes a first diode having an anode connected to the first terminal of the impedance circuit and a cathode connected to the second terminal of the impedance circuit.

4. The phase adjustment circuit of claim 3 wherein said at least one nonlinear device includes a second diode having a cathode connected to the first terminal of the impedance circuit and an anode connected to the second terminal of the impedance circuit.

5. The phase adjustment circuit of claim 3 wherein said first diode comprises a Schottky diode.

6. The phase adjustment circuit of claim 3 wherein said first diode comprises a Zener diode.

7. In an inductive drive meter including a rotating disk and a current stator, a phase adjustment circuit for adjusting the phase of flux generated in the current stator, said phase adjustment circuit comprising:

an impedance circuit having at least first and second terminals, said impedance disposed in a flux inducing relationship with the current stator such that the flux within the current stator induces a voltage across the first and second terminals of said impedance circuit;

a first current limiting device having a first bias threshold, the first current limiting device connected between the first and second terminals of the impedance circuit, said first current limiting device operable to substantially inhibit current flow in a first direction through the impedance circuit based on whether the voltage induced on said impedance circuit exceeds the first bias threshold.

8. The phase adjustment circuit of claim 7 wherein the first current limiting device is further operable to inhibit current flow in a first direction through the impedance circuit when the voltage induced on said impedance circuit is less than the first bias threshold, and allow current flow in a first direction through the impedance circuit when the voltage induced on said impedance circuit exceeds the first bias threshold.

9. The phase adjustment circuit of claim 8 wherein the first current limiting device comprises a diode.

10. The phase adjustment circuit of claim 9 wherein the diode is operable to inhibit current flow in a second direction based on whether the voltage induced on said impedance circuit exceeds a second first bias threshold.

11. The phase adjustment circuit of claim 7 wherein the current limiting device further includes a reverse bias threshold and is further operable to inhibit current flow in a second direction based on whether the induced voltage exceeds the reverse bias threshold.

12. The phase adjustment circuit of claim 11 wherein the current limiting device comprises a Zener diode.

13. The phase adjustment circuit of claim 11 wherein the current limiting device comprises a first diode having a cathode connected to the first terminal of the impedance circuit and an anode connected to the second terminal of the impedance circuit and a second diode having an anode connected to the first terminal of the impedance circuit and a cathode connected to the second terminal of the impedance circuit.

14. The phase adjustment circuit of claim 7 wherein the impedance circuit comprises an inductive coil.

15. An inductive drive revenue meter for measuring energy consumption of a facility through a set of power lines, the inductive drive revenue meter comprising:
 a voltage stator for connecting to the set of power lines and generating a first magnetic flux depending upon a voltage level of the set of power lines;
 a current stator for connecting to the set of power lines and generating a second magnetic flux depending upon a current level of the set of power lines;
 a rotating disk rotatably mounted to a housing and advantageously disposed to receive said first magnetic flux and said second magnetic flux, said rotating disk operable to rotate at a rate proportional to the amount of power consumed by the facility; and
 a phase adjustment circuit operably coupled to said current stator to adjust the phase of the second magnetic flux based on whether the current level exceeds a predetermined threshold.

16. The inductive drive watt-hour meter of claim 15 wherein the phase adjustment circuit further comprises:
 an impedance circuit operable to generate a first current based on a first voltage induced by the second magnetic flux density, said first current inducing a compensation flux density component into the current stator that adjusts the phase of the second magnetic flux density;
 a first current limiting device operable to inhibit the first current based on whether the first voltage induced by the second magnetic flux density exceeds a predetermined threshold.

17. The inductive drive watt-hour meter of claim 15 wherein the phase adjustment circuit further comprises an impedance circuit having at least first and second terminals, at least one nonlinear device having at least first and second terminals connected, respectively, to the first and second terminals of the impedance circuit, said impedance circuit disposed in a flux inducing relationship with said current stator.

18. The inductive drive watt-hour meter of claim 17 wherein the impedance circuit comprises an inductive coil.

19. The inductive drive watt-hour meter of claim 18 wherein the nonlinear device includes at least one diode.

20. The inductive drive watt-hour meter of claim 18 wherein the nonlinear device includes a first diode having an anode connected to the first terminal of the inductive coil and a cathode connected to the second terminal of the inductive coil, and further includes a second diode having a cathode connected to the first terminal of the inductive coil and an anode connected to the second terminal of the inductive coil.

21. The inductive drive watt-hour meter of claim 19 wherein said at least one diode comprises a Schottky diode.

22. The inductive drive watt-hour meter of claim 19 wherein said at least one diode comprises a Zener diode.

23. In an inductive drive meter including a rotating disk and a current stator, a phase adjustment circuit comprising an impedance circuit having at least first and second terminals, at least one nonlinear device including a first diode having an anode and a cathode connected, respectively, to the first and second terminals of the impedance circuit, said impedance circuit disposed in a flux inducing relationship with said current stator.

* * * * *